(12) United States Patent
Shiomoto et al.

(10) Patent No.: US 6,967,979 B2
(45) Date of Patent: Nov. 22, 2005

(54) SEMICONDUCTOR LASER DEVICE, OPTICAL PICKUP AND FABRICATION METHOD OF SEMICONDUCTOR LASER DEVICE

(75) Inventors: Takehiro Shiomoto, Kashihara (JP); Kenzo Nozaki, Ikoma (JP); Toshihiko Yoshida, Nara (JP); Masayuki Honda, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 306 days.

(21) Appl. No.: 09/971,207

(22) Filed: Oct. 4, 2001

(65) Prior Publication Data

US 2002/0041612 A1 Apr. 11, 2002

(30) Foreign Application Priority Data

Oct. 6, 2000 (JP) .................................... 2000-307462
Apr. 11, 2001 (JP) .................................... 2001-112770

(51) Int. Cl.⁷ ................................................ H01S 5/00
(52) U.S. Cl. ........................................ 372/43; 369/121
(58) Field of Search ................ 372/36, 43; 369/112.01, 369/112.29, 121, 122

(56) References Cited

U.S. PATENT DOCUMENTS 4,987,566 A * 1/1991 Shikama et al. ............ 369/122
6,700,911 B2 * 3/2004 Kohashi et al. ............. 372/43

FOREIGN PATENT DOCUMENTS

| JP | 61-250844 A | 11/1986 |
|---|---|---|
| JP | 61-250845 A | 11/1986 |
| JP | 62-018080 | 1/1987 |
| JP | 62-052737 A | 3/1987 |
| JP | 62-118468 | 7/1987 |
| JP | 03-106089 | 5/1991 |
| JP | 4-111776 | 9/1992 |
| JP | 08-037339 | 2/1996 |
| JP | 09-324127 A | 12/1997 |
| JP | 2002-026439 | 1/2002 |

OTHER PUBLICATIONS

U.S. Appl. No. 09/725,513, filed Nov. 30, 2000.

* cited by examiner

*Primary Examiner*—Minsun Oh Harvey
*Assistant Examiner*—James Menefee
(74) *Attorney, Agent, or Firm*—William J. Daley, Jr.; David G. Conlin; Edwards & Angell, LLP (57) ABSTRACT

A semiconductor laser device and optical pickup in which the reflectance of the side beam at a header portion will not adversely affect the characteristics of the optical pickup, and superior in productivity, and a method of fabricating such a semiconductor laser device are obtained. A reflector is attached on a side beam incident region of a leading end plane of a header mounted with a laser chip that emits a laser beam. Said side beam is one of the two side beams generated by the reflected ±first order beams and fed back through the optical system returning towards the header portion to strike the side beam incident region. The reflector reflects side beam outside the optical system.

14 Claims, 7 Drawing Sheets

← INFORMATION SPOT
ALIGNMENT OF BEAM
SPOTS (3 BEAMS)

SEMICONDUCTOR LASER DEVICE, OPTICAL PICKUP AND FABRICATION METHOD OF SEMICONDUCTOR LASER DEVICE

BACKGROUND OF THE INVENTION

1. Field of the Invention

The present invention relates to a semiconductor laser device, an optical pickup and a fabrication method of a semiconductor laser device. More particularly, the present invention relates to a semiconductor laser device and optical pickup used in an optical disk system that carries out tracking control by the 3-beam method and a fabrication method of a semiconductor laser device.

2. Description of the Background Art

Figure 8A:
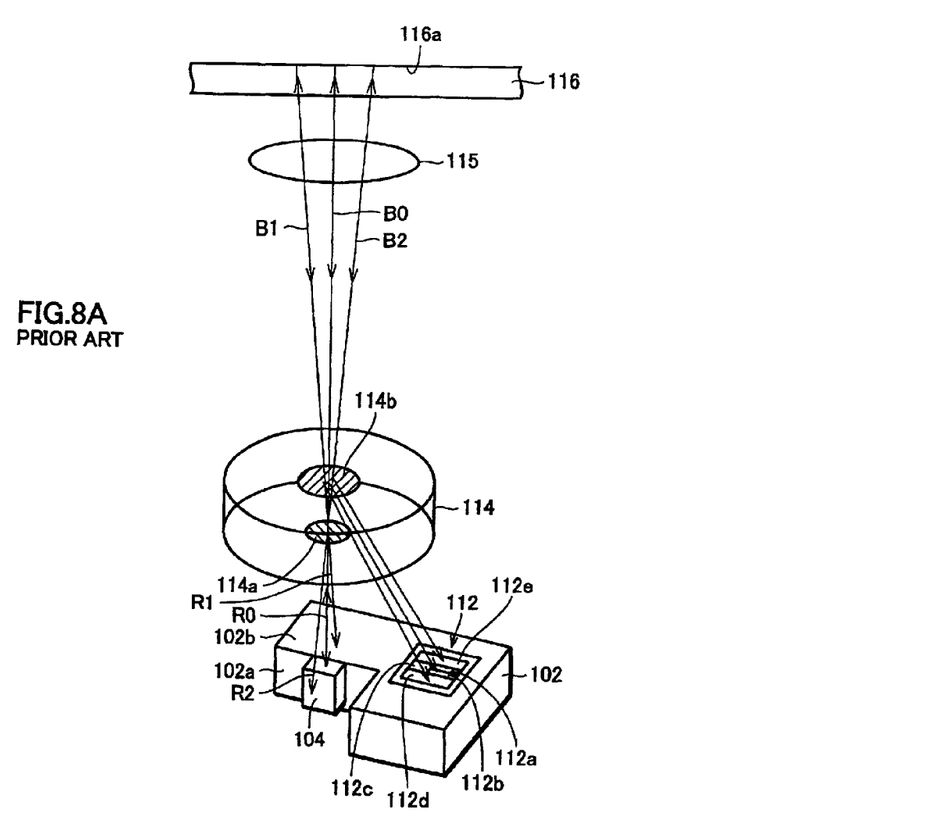
FIG. 8A shows a conventional optical pickup.
Figure 8B:
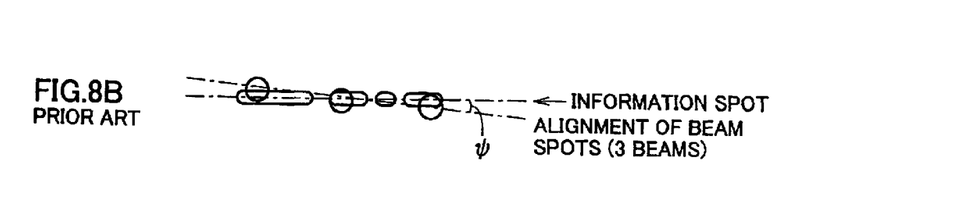
FIG. 8B shows the arrangement of the information track and the spots of three beams.

A conventional optical pickup carrying out tracking control by the 3-beam method is shown in FIG. 8A. Referring to FIG. 8A, a semiconductor laser chip 104 is mounted on a mount plane 102a of, for example, a stem 102. In stem 102 is mounted a photodetector 112 on an orthogonal plane 102b substantially orthogonal to mount plane 102a. The laser beam emitted from semiconductor laser chip 104 is divided into the 0th-order beam i.e., a main beam B0, and side beams B1 and B2 which are the ±first order beams. These three beams are collected on an information recording plane 116a of an optical disk 116. The three collected spots are disposed along a direction tilted several degrees (ψ) to the information track direction where the signal pits are aligned, as shown in FIG. 8B.

In the case where main beam B0 is located at the center of the information track which is a sequence of signal pits recording signals, the two side beams B1 and B2 are located at opposite directions about the center of the information track by equal distance. In other words, the two side beams cover the same area of signal pits. In contrast, when the main beam B0 is deviated from the center of the information track, the area of signal pits covered by the two side beams B1 and B2 will differ from each other.

The reflected light from optical disk 116 enters photodetector 112 through an optical element that has beam split capability such as a hologram 114b. Hologram 114b and a diffraction grating 114a are formed on a transparent substrate 114. This transparent substrate 114 is generally formed integrally with stem 102. Photodetector 112 is divided into a plurality of detector elements so that side beam B1 is detected by a photodetector element 112d whereas side beam B2 is detected by a photodetector element 112e, for example.

The position relationship between the information track and the main beam is detected as set forth below by photodetector 112 that detects the side beams. When the main beam is located at the center of the information track, the signals from the photodetector detecting the two side beams are equal in level. More specifically, the signal intensity Sd from photodetector element 112d is equal to the signal intensity Se from photodetector element 112e. The relationship of Sd=Se is established. When the main beam is offset from the center of the information beam, the signal of one side beam will become greater than the signal of the other side beam according to the offset direction. By detecting the difference (Sd−Se) of the signal levels of the side beams and adjusting the position or the like of an objective lens 115 having a beam-condensing function so that the difference becomes zero, the main beam can be maintained at the center of the information track. This is the mechanism of the tracking error control by the general 3-beam method.

Figure 9:
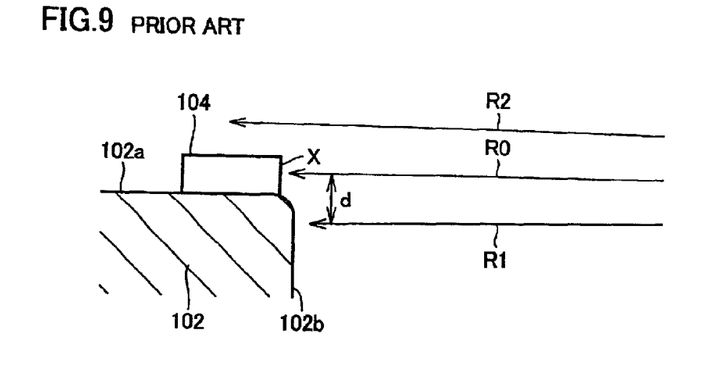
FIG. 9 shows the position of the three return beams in the conventional optical pickup.

Although the optical pickup employing the 3-beam method relies on the characteristic of the beam splitter, not all the light reflected from the optical disk enters the photodetector. The reflected light partially passes straight through the hologram to return to the proximity of the light emitting point X of semiconductor laser chip 104 as a main beam R0 and side beams R1 and R2, i.e. three return beams as shown in FIG. 8A and FIG. 9. These three beams are spaced apart from each other by the distance d of approximately 70–120 μm in the proximity at the side plane of semiconductor laser chip 104. The return side beam R1 incident on plane 102b orthogonal to semiconductor laser chip mount plane 102a of stem 102 is reflected at orthogonal plane 102b to return towards optical disk 116. This return side beam is diffracted at hologram 114b to directly enter photodetector elements 112d and 112e, or reflected at each plane of objective lens 115, the surface of optical disk 116, information recording plane 116a and the like. This reflected side beam is further diffracted by hologram 114b and directly enters photodetector element 112d or 112e to disturb the tracking control signal.

To eliminate such a problem, several conventional measures were taken. For example, with respect to R2: (a) the thickness of semiconductor laser chip 104 was adjusted so as to pass above the position of light emitting point X of semiconductor laser chip 104; and (b) the reflectance at the semiconductor laser chip end plane is reduced to 10% and below to prevent much of the light quantity from returning to the optical disk. Furthermore, the other side beam RI was caused: to (a) be incident upon stem 102 to be scattered; or (b) to be incident upon a submount (not shown) having a low reflecting film.

FIG. 9 shows an example of the above structure disclosed in Japanese Patent Laying-Open No. 62-52737 by the present applicant. The light emitting point X of semiconductor laser chip 104 is set to be in the proximity of the middle of the chip's height, i.e. approximately 50 μm from mount plane 102a of the stem. Since return side beam R2 is apart from return main beam R0 by a distance of approximately d=70–120 μm, side beam R2 will pass over semiconductor laser chip 104 and not return to the optical disk. In contrast, return side beam R1 will be incident on stem surface 102b. Therefore, the surface 102b of the stem is roughened for scattering. By this roughening process, the quantity of light that is reflected to return to the optical disk among the return side beam is significantly reduced. In practice, a tracking error signal of high reliability can be obtained by configuring an optical pickup using such a semiconductor laser. Stable tracking control can be achieved.

However, it has been identified recently that there is a case where the reflecting effect of return side beam RI at orthogonal plane 102b of the stem cannot be prevented sufficiently. Possible causes of such an event are set forth below.

(a) Various types of optical disks have been developed.

(b) A control method called differential push-pull (DPP) using side beams similar to the 3-beam method has been employed as the tracking control method. In the DPP method, the position relationship of the three beams, the relationship between the beam direction and the optical disk track, and the like differ from those of the 3-beam method.

(c) A high power laser of more than 50 mW at the end plane of the semiconductor laser chip is employed for the optical pickup of the information rewritable optical disk.

It is now necessary to further reduce the reflectance at orthogonal plane 102b of the stem to deal with the above-described causes. The following methods are known to reduce the reflectance at stem orthogonal plane 102b in addition to the plane roughening process.

Figure 10:
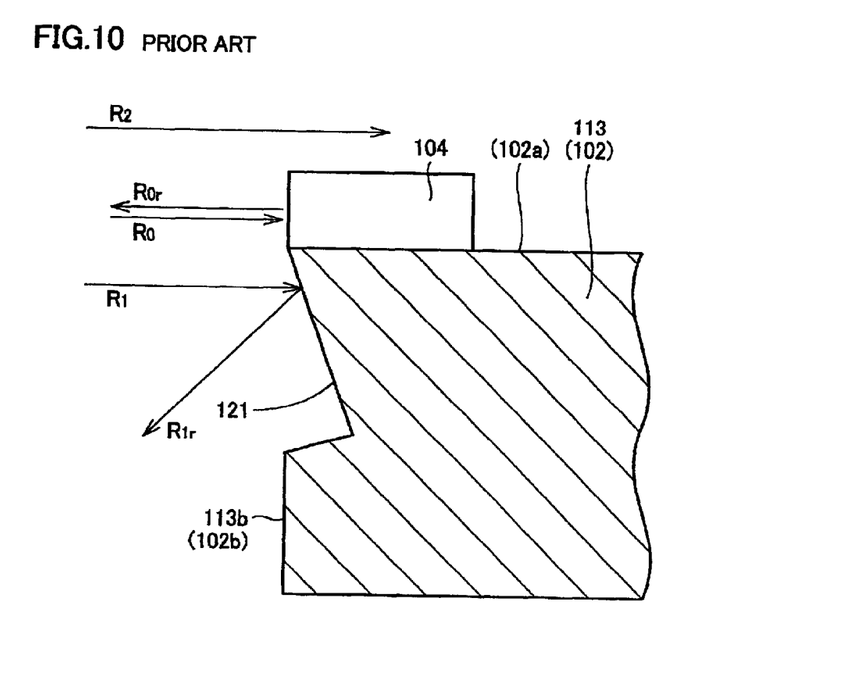
FIG. 10 is a partial enlarged schematic sectional view of the header portion of a conventional semiconductor laser device.

(a) As shown in FIG. 10, an inclination portion 121 is provided at the stem orthogonal plane 102b where return side beam R1 strikes (Japanese Patent Laying-Open No. 61-250844).

(b) The light emitting point of the semiconductor laser is set upwards remote from mount plane 102a, and apply a low reflecting material at the end plane of the semiconductor laser chip at the side closer to the mount plane (Japanese Patent Laying-Open No. 62-18080).

(c) A nonreflective coating is applied on the stem (header portion) where side beam R1 strikes (Japanese Patent Laying-Open No. 61-250845).

These above methods allow the reflectance of the return side beam to be reduced significantly. For example, according to the structure of the above (a) shown in FIG. 10, return light R1 is reflected at inclination plane 121 provided at surface 113b of header 113 to be radiated as reflected light Rir out from the optical system. Therefore, light interference and the like will not occur at the optical system of the optical pickup. However, each of the above methods has an incidental problem. For example, the method of providing an inclination portion 121 at orthogonal plane 102b at the stem shown in FIG. 10 (Japanese Patent Laying-Open No. 61-250844) has difficulty in mass production. There was a fatal problem in productivity. This problem will be described in detail with reference to FIGS. 11A and 11B.

Figure 11A:
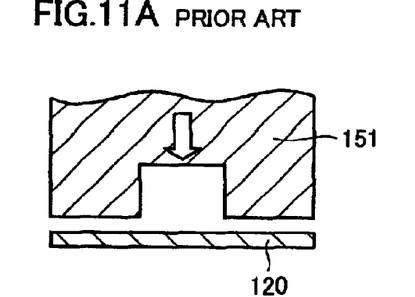
FIGS. 11A and 11B schematically show the formation method of the header portion of a conventional semiconductor laser device, corresponding to the status before and during shaping, respectively.
Figure 11B:
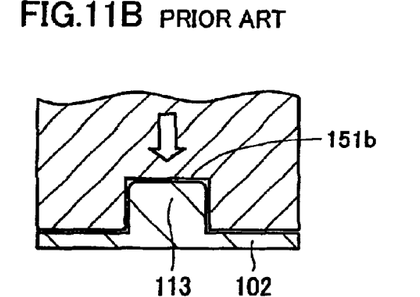

In general, header portion 113 is formed on stem 102 by press-molding. Specifically, header portion 113 is formed by pressing a warp-like (thin elongated sheet) iron material 120 with a die 151. In order to form a projection corresponding to head portion 113 from iron material 120 which is a flat sheet, an extremely strong stress must be applied to die 151. It is to be particularly noted that the portion 151b facing the leading end plane 113b (102b) of header portion 113 receives the greatest force in order to maintain leading end plane 113b planar. If the aforementioned inclination plane 121 is to be provided at the leading end plane 113b (102b) of header portion 113, die 151 must be formed with an inclination plane formation portion of a projection or recess corresponding to inclination plane 121. However, since this inclination plane formation portion corresponds to the region where the greatest force is applied, this inclination plane formation portion is easily susceptible to damage by the stress. Thus, the productivity thereof was extremely poor. In the worst case, this will induce damage of die 151 per se. In practice, it was impossible to provide stem 102 with header portion 113 having inclination plane 121 as described above directly formed by mass production.

Also, the method of applying a low reflective material at the end plane of the semiconductor laser chip at the closer side to the mount plane (Japanese Patent Laying-Open No. 62-18080) as well as the method of applying a nonreflective coating on the header portion (Japanese Patent Laying-Open No. 61-250845) causes the fabrication process of such a semiconductor laser device to become complicated, resulting in increase in the fabrication cost.

SUMMARY OF THE INVENTION

The object of the present invention is to provide a semiconductor laser device that can be easily fabricated and having reflectance of the returning side beam reduced to an acceptable level, an optical pickup, and a method of fabricating such a semiconductor laser device.

According to an aspect of the present invention, a semiconductor laser device is employed in an optical pickup of the 3-beam method that divides one laser beam into three beams which are the 0th-order beam and ±first order beams using an optical system for radiation to an optical recording medium and that detects information recorded on the recording medium as well as detect tracking error information in the detection mode by the reflected 0th-order beam and reflected ±first order beams from the recording medium. The semiconductor laser device is characterized in that a reflector is attached on a side beam incident region of a leading end plane of a header portion mounted with a laser chip emitting the laser beam. The side beam is one of the two side beams generated by the reflected ±first order beams and fed back through the optical system returning towards the header portion to strike the side beam incident region. The reflector reflects the side beam outside the optical system.

According to the present invention, the stem and header portion are formed by press-working using a die, and then a reflector which is independently formed from the stem is attached at the leading end plane of the header portion. Therefore, the disadvantage of breakage of the inclination plane formation portion or the die per se encountered using the conventional die does not occur. Mass production is possible. Furthermore, the properties of the optical pickup will not be degraded since the side beam is reflected outside the optical system by the reflector.

The reflector is preferably attached to the leading end plane of the header portion so that the distance between the reflecting plane and the light emitting point at the emitting end of the laser chip is at least 50 μm and not more than 150 μm.

By setting the position of attaching the reflector within this range, the side beam can be reflected outside the optical system without being influenced by the property of the optical pickup in which the semiconductor laser device is employed.

The reflector preferably has the reflecting plane set inclined at least 10 degrees to the plane orthogonal to the main beam that is generated by the 0th-order beam and fed back through the optical system. Accordingly, reentrance of the side beam to the optical system can be prevented effectively.

Preferably, the reflector has an inclination plane of a plurality of stages whose cross section is a saw-toothed. By taking such a configuration, the protruding height of the reflector from the leading end plane of the header portion can be suppressed to avoid being an obstruction in the subsequent process.

The reflector may be formed of a material of synthetic resin or metal, further preferably a material that can easily be attached to the header portion by an adhesive.

Thermosetting resin can be employed as the synthetic resin for the reflector. In this case, the reflector will not peel off from the header portion even if a heating process is applied in the assemble process after the reflector is attached or in the soldering process for connection with external circuitry by virtue of the nature of the thermosetting resin.

A metal with hardness lower than that of the metal forming the header portion can be used as the metal for the reflector. Indium, gold, aluminium, silver and the like meet the requirement of such a metal when the header portion is mainly formed of iron. By using such metals, the reflector can be attached to the header portion without using an adhesive.

A method of fabricating a semiconductor laser device of the present aspect includes the steps of attaching a base material of a reflector formed of metal that is softer than the metal forming the header portion or of a synthetic resin prior to being cured at a reflected side beam incident region at the leading end plane of the header portion, and then shaping the base material into a reflector having a predetermined configuration.

According to this method, the amount of material used for the reflector can be minimized, in addition to the advantage that mass production is facilitated. Thus, the cost can be reduced.

According to another aspect of the present invention, a semiconductor laser device includes a stem where a semiconductor laser chip is mounted. The stem includes a mount plane where the semiconductor laser chip is mounted, as well as a cross plane crossing the mount plane and facing a laser beam irradiated body on which the laser beam emitted from the semiconductor laser strikes. The cross plane is covered with a reflectance-reducing material that reduces the reflectance to the laser beam lower than the reflectance of the cross plane so that the amount of light reflected at the cross plane to be directed towards the laser irradiated body is reduced.

By the above structure, the reflectance of beam incident on the stem among the return side beam can be reduced. Therefore, a tracking error signal of high reliability can be obtained even in the case where a high output power semiconductor laser chip is employed as the light source of an optical disk system of the information rewritable type or new type and a tracking error control system of the 3-beam method or a similar method thereof such as DPP is employed. The above laser light irradiated body refers to an optical disk or the like.

In the semiconductor laser device of the present aspect, the reflectance-reducing material scatters and/or absorbs the laser beam directed towards the cross plane.

By scattering and/or absorbing the laser beam, the amount of light reflected at the cross plane to return towards the optical disk can be reduced. Therefore, the tracking error signal will not be disturbed substantially even if tracking control by the 3-beam method or similar DPP method is carried out in an optical disk system of the rewritable or new type using a high output power semiconductor laser chip.

In the semiconductor laser device of the present aspect, the reflectance-reducing material is preferably applied continuously to the mount plane. The portion of the reflectance-reducing material applied on the mount plane is used as the bonding material to die-bond the semiconductor laser chip to the stem.

In the case where the above-described material of reducing the reflectance is an adhesive such as a die bond material, the material can be applied continuously from the mount plane where the semiconductor laser chip is die-bonded through the cross portion to the cross plane. For example, when the silver paste is the material to reduce reflectance, die-bonding can be effected using the silver paste. Here, by applying the silver paste to spread from the die bond to the cross plane, the silver paste applied at the cross plane of the stem to reduce the reflectance is continuous. This continuation of the silver paste allows the lower portion of the end plane of the semiconductor laser chip to be covered with the silver paste. The scattering effect is not lost even if the striking position of the return side beam varies slightly. Therefore, the reflectance will not increase. In this case, there is little adverse effect on the electric characteristics even if the silver paste is applied on the mount plane since the silver paste per se has conductivity. There is a great advantage in using silver paste for the die bond of the semiconductor laser chip.

In the semiconductor laser device of the present aspect, the crossing portion between the mount plane and the cross plane has, for example, an R configuration. The reflectance-reducing material is applied at the region adjacent to the region of the R configuration.

Since the return laser beam striking the portion of the R configuration does not return to the laser irradiated body side and reflected in a direction greatly deviated from that direction, the above material does not have to be applied on the R configuration portion. By minimizing the area where the material is applied, the risk of applying the material over the light emitting point at the end plane of the semiconductor laser chip can be reduced.

In the semiconductor laser device of the present aspect, the reflectance-reducing material is, for example, a conductive die bond paste.

Therefore, there is no problem even if the material is attached to the mounting plane of the semiconductor laser chip since the applied material is a conductive die bond paste that die-bonds the semiconductor laser chip to the stem. Thus, fabrication of a semiconductor laser device is facilitated.

In the semiconductor laser device of the present aspect, the conductive die bond paste can include, for example, an epoxy resin and silver.

The conductive die bond paste of reducing the reflectance is a silver paste having silver added to the epoxy resin. The silver has at least one type of shape of a needle crystal or flake crystal to promote scattering and suppress reflectance of the beam towards the laser irradiated body. Thus, the reflectance can be set low enough.

In the semiconductor laser device of the present aspect, the reflectance-reducing material can include at least one type of epoxy resin and UV resin, for example, and at least one type of silica and carbon powder.

By using the above material, absorption with respect to the laser beam can be increased. Furthermore, the above material has high adherence with the stem even when subjected to high temperature during the fabrication and usage of the semiconductor laser device. Therefore, the reflectance will not be increased. The UV resin refers to resin that is cured when exposed to ultraviolet ray.

The optical pickup of the present invention includes a semiconductor laser device mounted with a semiconductor laser chip, a diffraction grating diffracting the laser beam emitted from the semiconductor laser chip, a beam splitter partially splitting the diffracted laser beam, and a photodetector detecting the intensity of the laser beam split by the beam splitter. The semiconductor laser employed in the optical pickup is any one of the above-described semiconductor laser device.

By using any of the above-described semiconductor laser device in the optical pickup, the reflectance of light towards the cross plane of the stem can be reduced. Therefore, a tracking error signal of high reliability can be obtained even if a high output power semiconductor laser chip is employed.

In the optical pickup of the present invention, the laser beam emitted from the semiconductor laser chip is divided into the three major beams, i.e., one main beam and two side beams, by the diffraction grating. These three beams are directed to an optical disk and reflected therefrom. At least two beams of the three beams are partially split by the beam splitter. A split beam detection output is obtained for the two split beams by the photodetector. A tracking error signal corresponding to the tracking status of the main beam directed onto the optical disk is obtained.

According to the above structure, a tracking error signal of high reliability can be obtained even using a high output power semiconductor laser chip in the optical pickup employing a tracking error control system of the 3-beam method or a similar method using the side beams such as the DPP. In other words, a tracking error signal of high reliability can be obtained even if a high output power semiconductor laser chip is used in an optical disk system, regardless of whether the optical disk is of the information rewritable type or new type.

A method of fabricating the semiconductor laser device of the present aspect is directed to fabricating a semiconductor laser device including a stem where a semiconductor laser chip is to be mounted. The fabrication method includes the steps of preparing a stem including a mount plane where the semiconductor laser chip is to be mounted and a cross plane crossing said mount plane and facing a laser irradiated body on which a laser beam emitted from said semiconductor laser chip strikes covering the cross plane with a material reducing the reflectance to the laser beam lower than the reflectance of the cross plane so that the amount of light of the laser beam reflected thereat and directed to the laser irradiated body side is reduced, and mounting the semiconductor laser chip at the mount plane.

By the above fabrication method, a semiconductor laser device that provides a tracking error signal of high reliability can be obtained even if a high output power semiconductor laser chip is employed in the tracking control by the 3-beam or DPP method in an optical disk system of the rewritable type or new type. The semiconductor laser device is incorporated in the above structure to allow stable tracking control. The order of the step of applying the material reducing reflectance and the step of mounting the semiconductor laser chip at the mount plane is of no concern. In other words, either step can be carried out first.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
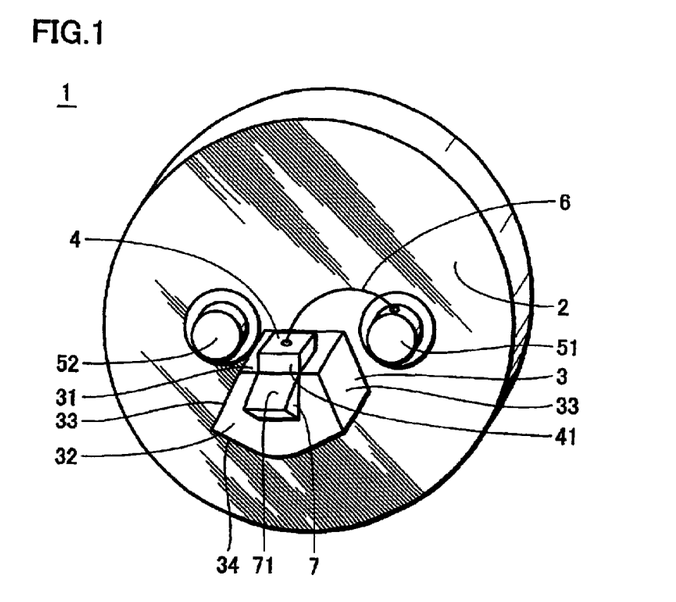
FIG. 1 is a perspective view of a semiconductor laser device according to a first embodiment of the present invention with the cap removed.
Figure 2:
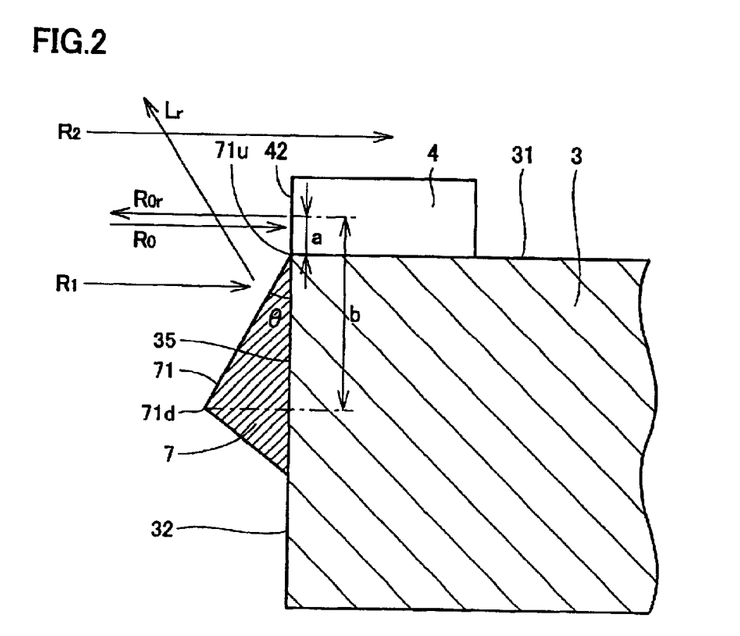
FIGS. 2, 3 and 4 are partial enlarged schematic cross sectional views of the header unit according to first, second and third embodiments, respectively, of the present invention.

The first embodiment will be described with reference to FIGS. 1 and 2. FIG. 1 is a perspective view of the semiconductor laser device of the present invention with the cap removed. FIG. 2 is a partial enlarged schematic cross sectional view of the header portion.

A semiconductor laser device 1 includes a disk-like stem 2, a header portion 3 protruding substantially at the center area of stem 2, and a laser chip 4 mounted on an upper plane 31 of header portion 3.

By press working an iron material using a die, header portion 3 is formed integral with stem 2. The upper plane 31 of head portion 3 (laser chip mount plane) 31 and leading end plane (cross plane) 32 are formed as planar planes at right angles to each other, as shown in FIG. 2. In the illustrated example, both side planes 33 and a bottom plane 34 are formed as inclination planes and a curved plane, respectively. However, the configuration of these planes are not limited thereto.

A conventional laser chip is employed here for laser chip 4. Preferably, a laser chip having an outgoing end plane 41 of low reflectance or applied with a nonreflective coating is employed for the purpose of suppressing reflection of main beam R0. Laser chip 4 is fixed by a die bond material such as solder or silver paste at upper plane 31 of header portion 3 so that outgoing end plane 41 is flush with leading end plane 32 of header portion 3. Laser chip 4 is connected through a gold wire 6 to lead 51 out of one pair of leads 51 and 52 projecting from stem 2 at both sides of header portion 3.

A reflector 7 is attached to leading end plane 32 of header portion 3. Referring to FIG. 2, reflector 7 serves to reflect in a direction $L_r$ outside the optical system one of the two side beams R1 and R2 generated by the reflected ±first order beams fed back through the optical system and returned towards header portion 3, i.e., side beam R1 here. For this purpose, reflector 7 is attached to a side beam incident region 35 where side beam R2 strikes at leading end plane 32 of head portion 3.

In the present embodiment, reflector 7 is formed in triangular prism configuration, and attached on the above-described position of header portion 3 using an adhesive. The material of reflector 7 may be any metal or synthetic resin, provided that it can be attached to header unit 3 with an adhesive.

Reflector 7 is dimensioned so that the upper edge 71u of its reflecting plane 71 is located 50 μm (indicated by a in FIG. 2) from a light emitting point 72 at outgoing plane 41 of laser chip 4, and so that the lower edge 71d of reflector plane 71 is located 150 μm (indicated by b in FIG. 2) from light emitting point 42. In order words, reflector 7 is attached to leading end plane 32 of header portion 3 so that the distance between reflecting plane 71 of reflector 7 and light emitting point 42 of laser chip 4 is at least 50 μm and not more than 150 μm.

Furthermore, the inclination angle of reflecting plane 71 of reflector 7, i.e. the angle (indicated by θ in FIG. 2) with the perpendicular plane to main beam $L_m$ generated by the 0th-order beam and fed back through the optical system, is at least 10 degrees. This is effective in preventing side beam $L_{s2}$ from reentering the optical system.

Header portion 3 can be attached to reflector 7 before or after laser chip 4 is attached to header portion 3.

Semiconductor laser device 1 has a cap not shown attached and sealed hermetically to be employed for the optical pickup.

The synthetic resin used for reflector 7 may be thermosetting resin. In this case, the thermosetting resin is potted at leading end plane 32 of header portion 3 to be cured in a heaped up manner. The formed inclination plane is reflecting plane 71. The usage of thermosetting resin for reflector 7 provides the advantage that reflector 7 will not peel off from header portion 3 even when subjected to a heating process during the assembly process after reflector 7 is attached or during the soldering process for connection with external circuitry by virtue of the thermosetting nature.

Second Embodiment

Figure 3:
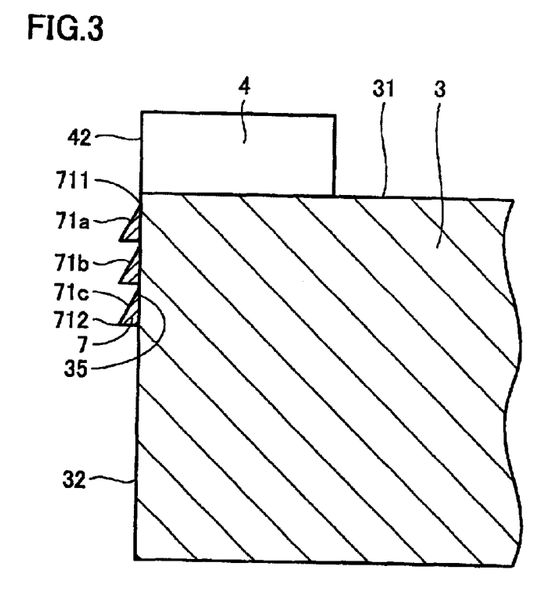

A semiconductor laser device according to a second embodiment of the present invention and a method of fabricating this semiconductor laser device will be described with reference to FIG. 3 showing a partial enlarged schematic cross section of the header portion. Components corresponding to those of the first embodiment have the same reference characters allotted, and description thereof will not be repeated.

In the second embodiment, reflector 7 is formed of a metal lower in hardness than the metal forming header portion 3. For example, in the case where header portion 3 is formed mainly by the metal of iron, indium is employed as the material for reflector 7. The metal material of reflector 7 is not limited to indium, and may be, for example, gold, silver, aluminium, or the like. Alternatively, a synthetic resin prior to curing can be used instead of such metal.

In the case where the above material is employed for reflector 7, the base material of the reflector such as indium is fused at leading end plane 32 of header portion 3. The base material is molded to a predetermined configuration with a die to form reflector 7. In the case this method is employed, the adhesive for the attachment of reflector 7 is not required, as compared to the first embodiment. The amount of material used for reflector 7 can be minimized.

In shaping the base material into reflector 7, the configuration of reflector 7 is not limited to the exemplified triangular prism of the first embodiment. As shown in FIG. 3, the reflector can have a saw-toothed cross section, including a plurality of stages of inclination planes 71a, 71b and 71c. Such a configuration of the reflector allows the protruding height H of the reflector from leading end plane 32 of header 3 to be suppressed. The lower height will prevent reflector 7 from being an obstruction in the subsequent process.

Third Embodiment

Figure 4:
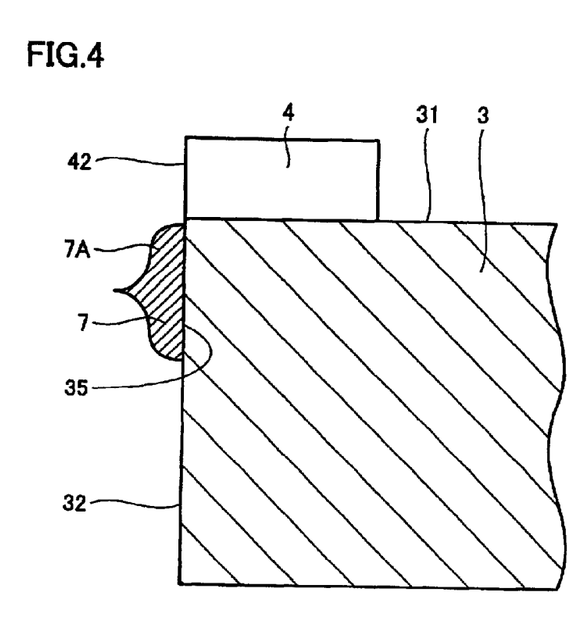

A semiconductor laser device according to a third embodiment of the present invention will be described with reference to FIG. 4 which is a partial enlargement schematic cross section of the header portion. Components corresponding to those of the first embodiment have the same reference characters allotted, and description thereof will not be repeated.

In the third embodiment, a gold ball 7A is employed as reflector 7. Specifically, a gold wire is ball-bonded to side beam incident region 35 at leading end plane 32 of header portion 3 by a wire bonding device. The gold wire is cut to form reflector 7. It is to be noted that a gold wire is generally thin having a diameter of approximately 50 μm, and that the ball bond position can be determined at the accuracy of the ball bonder. Therefore, ball 7A can be formed in high precision. Since the time required to form the reflector is substantially equal to the period of time required for the wire bonding process on the laser chip, the attaching process of reflector 7 to header portion 3 can be improved in speed.

Fourth Embodiment

Figure 5:
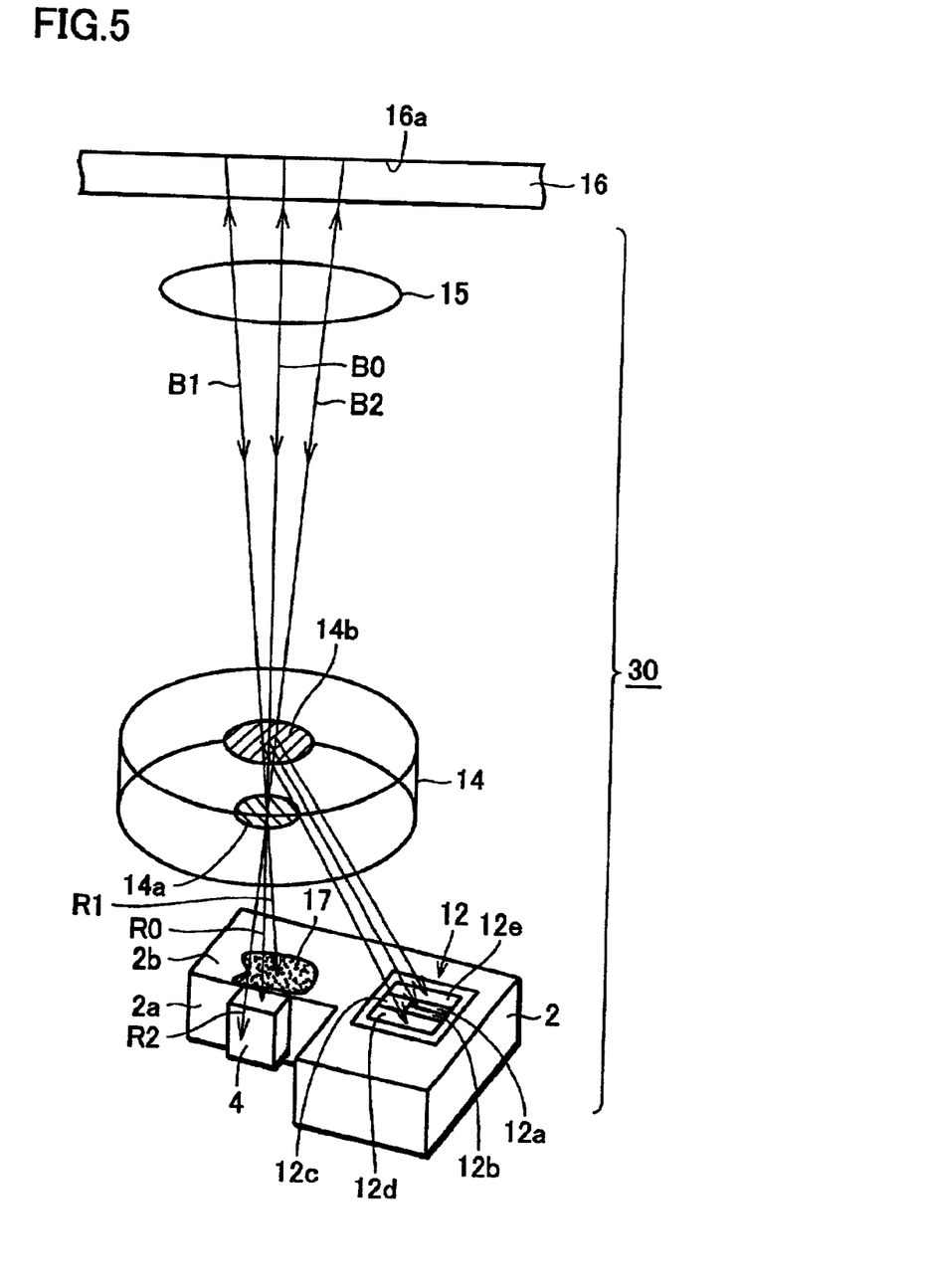
FIG. 5 shows the optical pickup according to a fourth embodiment of the present invention.

FIG. 5 shows an optical pickup 30 according to a fourth embodiment of the present invention. The semiconductor laser device includes a stem 2 integral with the header portion. A semiconductor laser chip 4 is mounted on stem 2. Stem 2 further includes a photodetector 12. In the description of the fourth embodiment and et seq., distinction between the stem and header portion is not particularly rendered. Above stem 2 is provided a transparent substrate 14 including a diffraction grating 14a and a hologram 14b. An optical disk 16 is positioned further above.

The laser beam emitted from semiconductor laser chip 4 is split into a main beam B0 and two side beams B1 and B2 by diffraction grating 14a provided at transparent substrate 14. These three beams are collected by an objective lens 15 on an information recording plane 16a of optical disk 16. The collected three spots are arranged along a direction tilted several degrees (ω) with respect to the information track where the signal pits are aligned. Therefore, when main beam B0 is located at the center of the information track where signals are recorded, the two side beams B1 and B2 are located at opposite directions from the center of the information track by equal distance. If main beam B0 is deviated from the center of the information track, the area of the two side beams B1 and B2 covering the information track will differ from each other.

The reflected light from optical disk 16 is caused to be incident on photodetector 12 by an optical element with the beam split capability such as hologram 14b. Diffraction grating 14a and hologram 14b are provided at transparent substrate 14. Transparent substrate 14 is generally integrated with stem 2. Photodetector 12 is divided into a plurality of detector elements. For example, side beam B1 is detected by a photodetector element 12d whereas side beam B2 is detected by a photodetector element 12e. Tracking error control by the general 3-beam method is effected using these optical elements.

The three laser beams partially pass through hologram 14b which is a beam splitter towards a cross plane 2b of the stem. The present invention is characterized in that a silver paste 17 formed of a material that reduces reflectance is applied on cross plane 2b of the stem. Cross plane 2b is the plane corresponding to leading end plane 32 of the header portion in the case where distinction between the stem and the header portion is made.

Figure 6A:
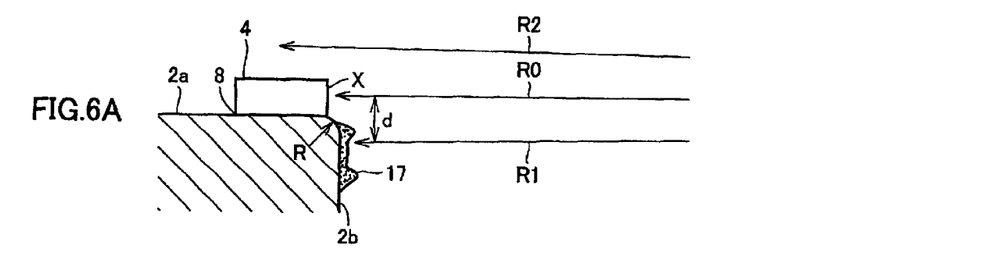
FIGS. 6A and 6B show the main part of a semiconductor laser device of the present invention employed in the optical pickup of FIG. 5, wherein FIG. 6A corresponds to the case where a silver paste is applied at the cross plane and FIG. 6B corresponds to the case where a silver paste is applied at both the cross plane and the die bond of the semiconductor laser chip in a continuous manner.

FIG. 6A shows a main part of the semiconductor laser employed in the optical pickup of the present embodiment. The crossing portion between mount plane 2a of stem 2 and cross plane 2b of the semiconductor laser device is subjected to an R configuration as shown in FIG. 6A. Mount plane 2a is the plane corresponding to upper plane 31 of the header portion in the case where distinction between the stem and header portion is made. In fabrication of this semiconductor laser device, a silver paste 17 formed of a reflectance-reducing material is applied at the region of cross plane 2b of the stem adjacent to the region of the R configuration. Then, the temperature is raised to cure silver paste 17. Next, semiconductor laser chip 4 is mounted on mount plane 2a of stem 2. In order to avoid the stress caused by heat during die-bonding, a soft metal 8 such as indium can be used as the bonding material of stem 2 and semiconductor laser chip 4. Since indium has favorable heat conductivity, a semiconductor laser chip of higher output power can be employed.

Figure 6B:
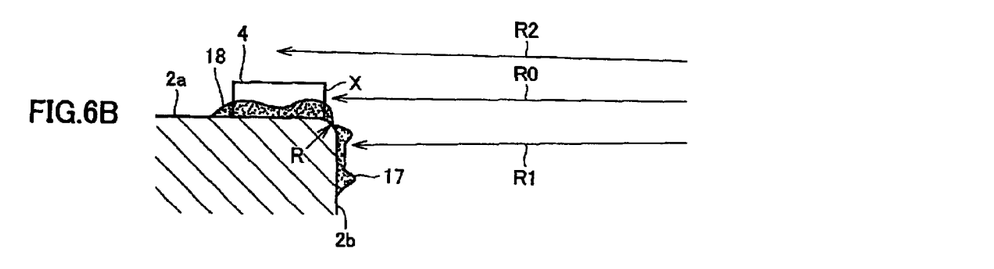

Semiconductor laser chip 4 can be die-bonded using silver paste. In this case, silver paste 18 for die-bonding is to be applied so as to spread towards cross plane 2b to be continuous with silver paste 7 applied on cross plane 2b of stem 2 to reduce the reflectance, as shown in FIG. 6B. In other words, the silver paste is applied continuously at cross plane 2b and mount plane 2a including the region of the R configuration. The continuity of the silver paste allows the lower portion of the end plane of the semiconductor laser chip to be covered with silver paste. The scattering effect will not be degraded even if the striking position of return side beam R1 slightly varies. Therefore, the reflectance will not be increased. The silver paste located at mount plane 2a will not adversely affect the electrical characteristics since silver paste per se is conductive. This is a great advantage in using silver paste for the die bond of semiconductor laser chip 4.

Since stem 2 is made of metal, hard soldering material such as an alloy of gold and tin that is thermally and mechanically stable cannot be used in the case where semiconductor laser chip 4 is directly die-bonded to the stem. In the case where a submount such as of silicon, silicon carbide (SiC) or the like is used, the aforementioned hard soldering material can be used in die-bonding semiconductor laser chip 4 on the submount. In this case, silver paste 7 that increases the scattering property and reduces reflectance is to be applied to the submount.

As an alternative method of fabricating the semiconductor laser device, first semiconductor laser chip 4 is mounted, and then silver paste 17 that improves the scattering effect is applied. Since semiconductor laser chip 4 is first mounted according to this fabrication method, caution must be exercised so that silver paste 7 does not cover light emitting point X of semiconductor laser chip 4. There is no problem even if silver paste 7 adheres to the end plane of semiconductor laser chip 4 as long as light emitting point X is not covered. In other words, even if the silver paste adheres to the end plane of the semiconductor laser chip, the problem of electrically short-circuiting between the p type impurity layer and the n type impurity layer of semiconductor chip 4 will not occur since the end plane of semiconductor chip 4 is coated with an insulation film.

By setting light emitting point X sufficiently remote from mount plane 2a, it is not so difficult to prevent the silver paste from covering light emitting point X. For example, light emitting point X is to be set at least 30 μm higher than mount plane 2a, similar to the conventional semiconductor laser device disclosed in Japanese Patent Laying-Open No. 62-52737.

By employing the above-described semiconductor laser device or optical pickup, the amount of light reflected at the stem cross plane towards the optical disk can be reduced even if a high output power semiconductor laser chip is used. Tracking error control by the 3-beam method can be effected stably. Such a stable tracking error control can be maintained irrespective of the type of the optical disk such as the rewritable type or new type as long as the tracking error control is effected by the 3-beam or similar DPP method.

The experiments for preliminary evaluation to ascertain the feature of the fourth embodiment of the present invention will be described hereinafter. The inventors of the present invention studied where the side beams return. Side beam R2 of the two side beams that return passes over semiconductor laser chip 4, as in the conventional case, and will not return to the optical disk. The other R1 of the side beams strikes against cross plane 2b of the stem. The region around the crossing line between mount plane 2a and cross plane 2b of the stem has an R configuration with a smooth surface. When side beam R1 strikes against the region of the R configuration around this cross plane, side beam R1 is partially reflected upwards and will not return to the optical disk. It was found that the reflectance is reduced to a level substantially acceptable.

Main beam R0 of the return beam comes back to light emitting point X of the semiconductor chip. The distance (height) of light emitting point X from mount plane 2a has an error of approximately 10 μm about 55 μm. The radius of curvature of the R around the crossing between mount plane 2a and cross plane 2b is approximately 30–60 μm, approximately 45 μm in average. Since the distance between main beam R0 and side beam R1 is approximately 60–120 μm, it was identified that the possibility of side beam R1 striking the region of the R configuration is high.

Figure 7:
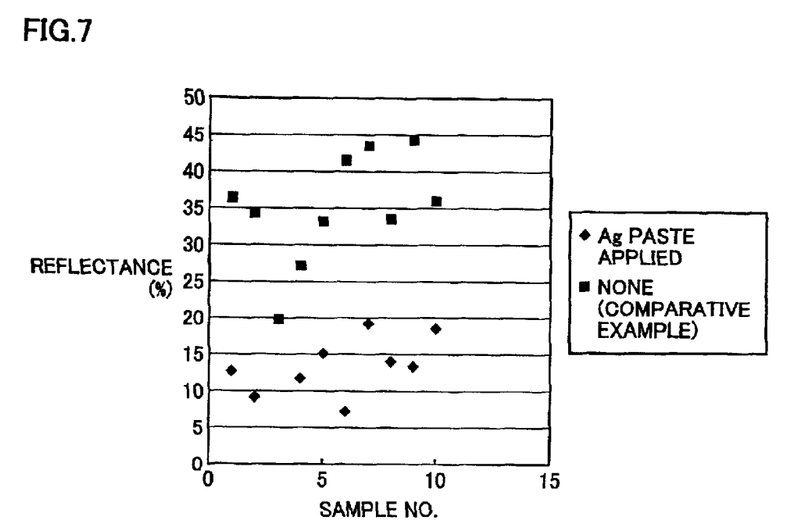
FIG. 7 shows the results of a preliminary test indicating that the reflectance is reduced lower than the reflectance at the laser chip end plane when the silver paste is applied.

The reflectance of the laser beam on cross plane 2b of the stem was actually measured to obtain the results shown in FIG. 7 as the comparative example. It was appreciated from the results that the reflectance was 20–45%, approximately 35% in average. In other words, the reflectance was equal to or greater than the reflectance of 32% when the end plane of the semiconductor laser chip is not particularly coated.

As a way of reducing the reflectance at cross plane 2b of the stem, the approach of further scattering the light was considered. As a result, it was found that, as the material of scattering light, a conductive die bond paste having silver filler added to epoxy resin, i.e. silver paste, exhibited favorable characteristics. When silver paste is applied as shown in FIG. 7, the reflectance falls in the range of 7–20%, and the center of the distribution was substantially 14%. A reflectance lower than that at the end plane of a semiconductor laser chip not subjected to coating is obtained.

The reason why the reflectance is low of the conductive paste that employs silver assumed to have high reflectance as a filler is that the silver filler of the silver paste is of the needle crystal or flake crystal form. The scattering effect with respect to the laser beam is great since the direction of the needle or flake crystals is random. Thus, the reflectance is reduced.

The present invention was accomplished based on the above results of preliminary study.

Fifth Embodiment

In the fifth embodiment of the present invention, the method of absorbing the laser beam is employed as the method of reducing the reflectance at cross plane 2b of the stem. A resin blackened with filler is applied instead of the silver paste used in the fourth embodiment. Here, the reflectance of cross plane 2b of the stem was lower than the value of the end plane of the semiconductor chip not subjected to coating.

The preferably resin is a thermosetting epoxy resin that has favorable adherence with the stem or an UV resin that is cured by exposure to ultraviolet ray. These resins are advantageous in that they do not easily peel off even when subjected to a thermal cycle. It is to be noted that they is a heating process of 200–300° C., when the semiconductor laser chip is mounted at the stem and a further heating process for testing after the mounting step. Therefore, peel off will not easily occur by using the foregoing resin.

As the filler to be added to the resin, silica or carbon is used. The reflectance can be reduced as a function of increasing the ratio of the added filler of these materials. However, if the added ratio is too high, the adherence will be degraded so that the resin will easily peel off. It is desirable to set the added amount as high as possible within the range that avoids peel off.

In the case where epoxy resin or UV resin added with filler as the reflectance-reducing material is employed as described above, it is desirable to apply the resin only at cross plane 2b as shown in FIG. 6A. Although the resin may be spread continuously to mount plane 2a including the cross portion of the R configuration as shown in FIG. 6B, a result as favorable as that for silver paste cannot be achieved since the adherence and the heat conductivity of the semiconductor laser chip are not favorable as by the silver paste. However, it is desirable to dispose the resin, even when of a material that reduces reflectance mainly by absorption, continuously at the mount plane including the crossing portion and the cross plane when the material is superior in adherence and heat conductivity. Specifically, it is desirable to use such material as a reflectance-reducing material at cross plane 2b and the neighborhood of the crossing portion, and as a bonding material to die-bond the semiconductor laser chip at mount plane 2a.

The present invention is not limited to that described in the foregoing. For example, any device employed in the optical pickup of the 3-beam method (or a similar tracking method using side beams), even if absent of the hologram or diffracting grating, is included in the semiconductor laser device of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising:
   a stem,
   a semiconductor laser chip,
   wherein said stem includes a mount plane and a cross plane crossing said mount plane and facing a laser irradiated body on which a laser beam emitted from said semiconductor laser chip strikes,
   a reflectance-reducing material being a resin containing a filler that scatters and/or absorbs said laser beam, where a crossing portion of the said mount plane and said cross plane is subjected to an R configuration and said reflectance-reducing material is applied at a region adjacent to the region of the R configuration, and
   wherein said semiconductor laser chip is disposed upon the mount plane and does not extend beyond the cross plane of the stem.

2. The semiconductor laser device according to claim 1, wherein said reflectance-reducing material is constituted so as to scatter said laser beam directed towards said cross plane.

3. The semiconductor laser device according to claim 1, wherein said reflectance-reducing material is applied continuously to said mount plane, and a portion of said reflectance-reducing material applied on said mount plane is used as a bonding material to die-bond said semiconductor laser chip to said stem.

4. The semiconductor laser device according to claim 1, wherein while said reflectance-reducing material is applied at a region adjacent to the region of the R configuration, said material is not applied in the region of the R configuration.

5. The semiconductor laser device according to claim 1, wherein said reflectance-reducing material includes a conductive die bond paste.

6. The semiconductor laser device according to claim 5, wherein said conductive die bond paste includes an epoxy resin and silver.

7. The semiconductor laser device according to claim 5, wherein said die-bond paste is discriminated from the bonding material to die-bond said semi-conductor laser chip at the region of the R configuration.

8. The semiconductor laser device according to claim 1, wherein said reflectance-reducing material includes at least one type of an epoxy resin and an UV resin, and at least one type of silica and carbon powder.

9. The semiconductor laser device according to claim 1, wherein said reflectance-reducing material is constituted so as to absorb said laser beam directed towards said cross plane.

10. The semiconductor laser device according to claim 1, wherein said resin is at least one type of an epoxy resin and a UV resin and said filler is at least one of silver powder, silica powder and carbon powder.

11. An optical pickup comprising:
   a semiconductor laser device mounted with a semiconductor laser chip;
   a diffraction grating diffracting a laser beam emitted from said semiconductor laser chip; a beam splitter partially splitting said diffracted laser beam; and
   a photodetector detecting an intensity of the laser beam split by said beam splitter; and
   wherein said semiconductor laser device further includes:
   a stem, said stem including a mount plane and a cross plane crossing said mount plane and facing a laser irradiated body on which a laser beam emitted from said semiconductor laser chip strikes,
   a reflectance-reducing material being a resin containing a filler that scatters and/or absorbs said laser beam, where a crossing portion of the said mount plane and said cross plane is subjected to an R configuration and said reflectance-reducing material is applied at a region adjacent to the region of the R configuration,
   wherein said semiconductor laser chip is disposed upon the mount plane and does not extend beyond the cross plane of the stem.

12. The optical pickup according to claim 11, wherein the laser beam emitted from said semiconductor laser chip is divided into three major beams by said diffraction grating, said three major beams including a main beam and two side beams, said three beams being directed to an optical disk and reflected from the optical disk, at least two of said three beams being split partially by said beam splitter, and a split beam detection output is obtained from said photodetector for said two split beams, whereby a tracking error signal corresponding to a tracking status of said main beam directed to said optical disk is obtained.

13. A method of fabricating a semiconductor laser device including a stem mounted with a semiconductor laser chip, said method comprising the steps of:

preparing a stem including a mount plane and a cross plane crossing said mount plane and facing a laser irradiated body on which a laser beam emitted from said semiconductor laser chip strikes, applying a reflectance-reducing material to at least a part of said mount plane and so that a portion of said reflectance-reducing material is used as a bonding material to die-bond said semiconductor laser chip to said stem mount plane, where the reflectance-reducing material is constituted so the reflectance to said laser beam is lower than the reflectance of said cross plane whereby an amount of light of said laser beam reflected at said cross plane to be directed towards said laser irradiated body is reduced, covering said cross plane with the reflectance reducing material, and mounting said semiconductor laser chip on said mount plane and securing said semiconductor laser chip to said stem mount plane using a portion of said reflectance-reducing material applied to the said stem mount plane such that the semiconductor laser chip does not extend beyond the cross plane of the stem.

14. The method of claim 13, wherein a crossing portion of said mount plane and said cross plane is subjected to an R configuration, and wherein said applying and covering are performed so the reflectance reducing material is applied at a region adjacent to the region of the R configuration but not in the region of the R configuration.

* * * * *